United States Patent
Li

(10) Patent No.: US 12,432,958 B2
(45) Date of Patent: Sep. 30, 2025

(54) DEVICE FORMED BY EPITAXIAL GROWTH FROM THE SIDE SURFACE OF A STEP

(71) Applicant: GUANGDONG ZHINENG TECHNOLOGY CO., LTD., Guangdong (CN)

(72) Inventor: Zilan Li, Guangdong (CN)

(73) Assignee: GUANGDONG ZHINENG TECHNOLOGY CO., LTD., Guangdong (CN)

( * ) Notice: Subject to any disclaimer, the term of this patent is extended or adjusted under 35 U.S.C. 154(b) by 503 days.

(21) Appl. No.: 17/788,030

(22) PCT Filed: Mar. 2, 2021

(86) PCT No.: PCT/CN2021/078736
§ 371 (c)(1),
(2) Date: Jun. 22, 2022

(87) PCT Pub. No.: WO2021/175222
PCT Pub. Date: Sep. 10, 2021

(65) Prior Publication Data
US 2023/0047052 A1    Feb. 16, 2023

(30) Foreign Application Priority Data

Mar. 5, 2020    (CN) .......................... 202010149409.5

(51) Int. Cl.
*H01L 29/778*    (2006.01)
*H01L 29/04*    (2006.01)
(Continued)

(52) U.S. Cl.
CPC ......... *H10D 30/475* (2025.01); *H10D 30/015* (2025.01); *H10D 62/117* (2025.01);
(Continued)

(58) Field of Classification Search
CPC .................................................. H10D 30/475
See application file for complete search history.

(56) References Cited

U.S. PATENT DOCUMENTS

| 2002/0117104 A1* | 8/2002 | Hata ................. H01L 21/02433 |
| | | 117/97 |
| 2006/0060871 A1* | 3/2006 | Beach .................. H10D 30/015 |
| | | 257/E29.253 |

(Continued)

FOREIGN PATENT DOCUMENTS

| CN | 105448977 | 3/2016 |
| CN | 105762078 | 7/2016 |

(Continued)

OTHER PUBLICATIONS

Stanislav Vitanov, "4.5 Spontaneous and Piezoelectric Polarization", https://www.iue.tuwien.ac.at/phd/vitanov/node65.html.*
(Continued)

*Primary Examiner* — Peter Bradford
(74) *Attorney, Agent, or Firm* — CASIMIR JONES, S.C.; Brian F. Bradley

(57) ABSTRACT

Provided are a semiconductor device and a method for manufacturing same. The device comprises: a substrate, a first insulating layer on the substrate, a plurality of trenches formed in the substrate, a nucleation layer arranged on one side wall of each trench, and a first semiconductor layer formed along the trenches by means of the nucleation layer. The present disclosure facilitates the achievement of one of the following effects: achieving a high height-width ratio and a high integration density, reducing an on-resistance, improving a threshold voltage, achieving a normally-off state, and providing a semiconductor device that has a high power and a high reliability, is suitable for a planarization process, is provided with an easy preparation method, and reduces costs.

13 Claims, 12 Drawing Sheets

(51) Int. Cl.
  *H01L 29/20* (2006.01)
  *H01L 29/66* (2006.01)
  *H10D 30/01* (2025.01)
  *H10D 30/47* (2025.01)
  *H10D 62/10* (2025.01)
  *H10D 62/40* (2025.01)
  *H10D 62/832* (2025.01)
  *H10D 62/85* (2025.01)

(52) U.S. Cl.
  CPC ....... *H10D 62/405* (2025.01); *H10D 62/8325* (2025.01); *H10D 62/8503* (2025.01)

(56) References Cited

U.S. PATENT DOCUMENTS

| | | | |
|---|---|---|---|
| 2014/0084299 A1 | 3/2014 | Schelling et al. | |
| 2014/0349427 A1* | 11/2014 | El-Ghoroury | H01L 21/02642 |
| | | | 438/31 |
| 2016/0190301 A1* | 6/2016 | Aichinger | H10D 30/668 |
| | | | 257/334 |
| 2017/0148796 A1* | 5/2017 | Basker | H10D 64/015 |
| 2018/0108656 A1 | 4/2018 | Lin et al. | |
| 2019/0006371 A1* | 1/2019 | Ohtou | H10D 62/393 |
| 2019/0140088 A1 | 5/2019 | Cheng | |

FOREIGN PATENT DOCUMENTS

| | | |
|---|---|---|
| CN | 110224019 | 9/2019 |
| CN | 111816700 | 10/2020 |

OTHER PUBLICATIONS

International Search Report and Written Opinion, International Patent Application No. PCT/CN2021/078736, dated May 28, 2021, 7 pages.
Korean Office Action for KR application No. 10-2022-7030710, mailed Oct. 11, 2024, 22 pages.

* cited by examiner

DEVICE FORMED BY EPITAXIAL GROWTH FROM THE SIDE SURFACE OF A STEP

CROSS-REFERENCES TO RELATED APPLICATIONS

This disclosure claims the priority of a Chinese patent application, filed with the Chinese Patent Office on Mar. 5, 2020, the application number of 202010149409.5 and titled "Semiconductor Device, Manufacturing Method and Application thereof", the entire content of which is incorporated herein by reference.

TECHNICAL FIELD

The present disclosure relates to the field of semiconductor devices, and more specifically, to a group III nitride semiconductor device, a manufacturing method and the use thereof.

BACKGROUND ART

A group III nitride semiconductor is an important new semiconductor material, which mainly comprises AlN, GaN, InN and compounds of these materials, such as, AlGaN, InGaN, AlInGaN, etc. Utilizing the advantages of the direct band gap, the wide forbidden band, and the high breakdown electric field strength of the group III nitride semiconductors, through optimized design of the structure and process of the devices, the group III nitride semiconductor has great prospects in the field of power semiconductors. The transistors with high electron mobility and high hole mobility are important devices using the group III nitride semiconductors. It is desired to develop a transistor with high electron mobility and high hole mobility, which has high performance, such as, the high withstand voltage, the high power and the low on-resistance, etc.

The existing transistors with high electron mobility and high hole mobility have the structure design in which the integration level per unit area is not high enough, and the existing transistors with high electron mobility and high hole mobility mostly are the normally-on devices, which is not good for energy saving and application security.

SUMMARY

In view of this, the present disclosure provides a novel semiconductor device structure and manufacturing method thereof.

In the following, a brief summary of the present disclosure will be given in order to help the basic understanding of certain aspects of the present disclosure. It should be understood that this summary is not an exhaustive summary of the present disclosure. It is not intended to determine the key or important part of the present disclosure, nor is it intended to limit the scope of the present disclosure. Its purpose is merely to present some concepts in a simplified form, as a prelude to the more detailed description that will be discussed later.

According to one aspect of the present disclosure, a manufacturing method for a semiconductor device is provided, comprising:

Step 1: providing a substrate, which has a first surface;
Step 2: forming a first insulating layer on the first surface of the substrate, with the first insulating layer having a first surface parallel to the first surface of the substrate;
Step 3: etching the first insulating layer and a part of the substrate to form a plurality of first step structures and second step structures arranged vertically and spaced apart, wherein a lower part of the first side surface of the plurality of first step structures and a lower part of the second side surface of the plurality of second step structures are respectively constituted by a second surface and a third surface of the substrate, and an upper part of the first side surface of the plurality of first step structures and an upper part of the second side surface of the plurality of second step structures are respectively constituted by a second surface and a third surface of the first insulating layer;
Step 4: forming a second insulating layer on third bottom surfaces of the first step structure and the second step structure;
Step 5: forming a single crystal nucleation layer on a second side surface of the first step structure, formed by a third surface of the substrate, and forming a single crystal nucleation layer on a first side surface of the second step structure, formed by the second surface of the substrate; and
Step 6: making a first semiconductor layer grown epitaxially laterally, with the single crystal nucleation layer as a nucleation center.

According to another aspect of the present disclosure, a manufacturing method for a semiconductor device is provided, comprising:

Step 1: providing a substrate, which has a first surface;
Step 2: forming a first insulating layer on the first surface of the substrate, with the first insulating layer having a first surface parallel to the first surface of the substrate;
Step 3: etching the first insulating layer and a part of the substrate to form a plurality of first trenches (grooves) and second trenches arranged vertically and spaced apart, wherein lower parts of first side surfaces and second side surfaces of the plurality of first trenches and second trenches are respectively constituted by a second surface and a third surface of the substrate, and upper parts of the first side surfaces and the second side surfaces of the plurality of first trenches and second trenches are respectively constituted by a second surface and a third surface of the first insulating layer;
Step 4: forming a second insulating layer on third bottom surfaces of the first trench and the second trench;
Step 5: forming a single crystal nucleation layer on a second side surface of the first trench, formed by a third surface of the substrate, and forming a single crystal nucleation layer on a first side surface of the second trench, formed by the second surface of the substrate; and
Step 6: making a first semiconductor layer grown epitaxially laterally, with the single crystal nucleation layer as a nucleation center.

Optionally, herein, the second surface and the third surface of the substrate are of a hexagonal symmetrical lattice structure.

Optionally, herein, the second surface and the third surface of the substrate are selected from the group consisting of Si (111) plane, $Al_2O_3$ (0001) plane, SiC (0001) plane, SiC (000-1) plane, GaN (0001) plane and GaN (000-1) plane.

Optionally, herein, in Step 5, a single crystal nucleation layer is formed on a part of a second side surface of the first trench or the first step structure, formed by a third surface of the substrate, and a single crystal nucleation layer is formed on a part of a first side surface of the second trench or the second step structure, formed by the second surface of the substrate.

Optionally, herein, the Step 5 can be replaced with Step 5', and in the Step 5', with the single crystal nucleation layer as a nucleation center, a first sub-layer of a first semiconductor layer is epitaxially laterally grown in the trenches, and then a doped third semiconductor layer is grown with the first sub-layer as a core, and then further a second sub-layer of the first semiconductor layer is grown, wherein the third semiconductor layer is N-type doped or P-type doped.

Optionally, herein, in the Step 5, before growing the first semiconductor layer, a buffer layer is deposited on the nucleation layer.

Optionally, herein, after the first and second trenches or the first and second step structures are formed, it further comprises forming a sacrificial layer through conformal deposition, wherein the sacrificial layer and the first insulating layer have the high etching selection ratio, and then retaining, through the dry etching, the sacrificial layer on the first side surface and the second side surface of the first trench and the second trench.

Optionally, herein, a second insulating layer is formed on the third bottom surface of the first and second trenches or the first and second step structures by using the sacrificial layer, and then the sacrificial layer is removed.

Optionally, a fourth insulating layer is respectively formed on the first side surface and the second side surface of the first and second trenches or the first and second step structures.

Optionally, the first insulating layer at the portion between the first and second trenches or the first and second step structures is exposed by a photolithography pattern, and the etching is performed to remove the exposed fourth insulating layer on the second side surface of the first trench or the first step structure and on the first side surface of the second trench or the second step structure, thereby exposing the third surface of the substrate in the first trench and the second surface of the substrate in the second trench.

Optionally, herein, after the formation of the single crystal nucleation layer, the nucleation layers on all the insulating layers need to be separately removed; or during the formation of the nucleation layer, the nucleation layer grows merely on the substrate but not on any of the insulating layers, by means of introducing gas containing chlorine.

Optionally, herein, the growth of the first semiconductor layer comprises growth in a direction perpendicular to the first surface of the substrate, wherein when the growth of the first semiconductor layer in a direction perpendicular to the first surface of the substrate exceeds the height of the trench or the step structure, the excess part of the first semiconductor layer is removed by planarization or etching technology.

Optionally, herein, the growth of the first sub-layer and the second sub-layer of the first semiconductor layer and the growth of the third semiconductor layer comprise the growth in a direction perpendicular to the first surface of the substrate, wherein when the growth of the first sub-layer and the second sub-layer of the first semiconductor layer and the third semiconductor layer in the direction perpendicular to the first surface of the substrate exceeds the height of the trench or the step structure, the excess part is removed through the planarization or the etching technique or the excess part is retained.

Optionally, a photolithography pattern is formed to expose a region between the first trench and the second trench which are adjacent, and the first insulating layer and a part of the substrate in the region are etched, exposing the first face of the first semiconductor layer having the spontaneous and piezoelectric polarization effect and the second surface opposite to the first face, with the second face having the spontaneous and piezoelectric polarization effect.

Optionally, a photolithography pattern is formed to expose a part of the region between the first trench and the second trench which are adjacent, and to expose a first face or a second face of the first semiconductor layer, having spontaneous and piezoelectric polarization effect; the first insulating layer in the region, a part of the substrate, and the exposed first face or second face of the first semiconductor layer are etched, exposing the second face or the first surface opposite thereto of the first semiconductor layer.

Optionally, a photolithography pattern is formed to expose a part of the region between the first trench and the second trench which are adjacent, and the first insulating layer and a part of the substrate are etched to expose a first face or a second face of the first semiconductor layer, which have spontaneous and piezoelectric polarization effect, and the second surface or the first surface opposite thereto is still covered by the substrate and the first insulating layer.

Optionally, a third insulating layer is formed on the substrate having been subjected to the etching, and then the third insulating layer on the first semiconductor layer is removed.

Optionally, a second semiconductor layer is formed on the exposed first semiconductor layer, so that two-dimensional electron gas is formed at the interface of the first face of the first semiconductor layer adjacent to the second semiconductor layer, and/or two-dimensional hole gas is formed at the interface of the second face of the first semiconductor layer adjacent to the second semiconductor layer.

Optionally, a plurality of stacks, which are composed of the first semiconductor layers and the second semiconductor layers alternately, are continuously formed on the second semiconductor layer.

Optionally, a dielectric layer is deposited, the dielectric layer is lithographically etched, and then metal is deposited, so as to form, along the length direction of the trench on the first face or the second face of the first semiconductor layer, a first electrode, a second electrode, and a third electrode, wherein the second electrode is in contact with the second semiconductor layer, and the first electrode and the third electrode are in contact with the second semiconductor layer or the first semiconductor layer.

Optionally, a fourth electrode is formed on the second face or the first face of the first semiconductor layer opposite to the first electrode, the second electrode, and the third electrode, and is connected with the third semiconductor layer.

Optionally, herein, the nucleation layer is formed at a position corresponding to the first electrode, or a position corresponding to the third electrode, or provided at a position corresponding to a portion between the second electrode and the third electrode.

Optionally, herein, when the nucleation layer is disposed at a position corresponding to the third electrode, a current blocking layer may also be formed in a direction perpendicular to the first face or the second face of the trenches.

Optionally, herein, corresponding doping is performed in the region corresponding to the first electrode and the region corresponding to the third electrode, of the first semiconductor layer, to form the corresponding first electrode region and third electrode region.

Optionally, herein, when the HEMT device is formed, the doping of the first electrode region and the third electrode region is N-type doping; and when the HHMT device is formed, the doping of the first electrode region and the third electrode region is P-type doping.

Optionally, herein, the doping of the first electrode region and the third electrode region and the doping of the third semiconductor layer are performed simultaneously, or the doping of the first electrode region, the doping of the third electrode region and the doping of the third semiconductor layer are performed sequentially.

According to one aspect of the present disclosure, a semiconductor device is provided, comprising:
- a substrate, the substrate having a first surface;
- a first insulating layer, which is formed on a first surface of the substrate and has a first surface parallel to the first surface of the substrate; and
- a plurality of first trenches and second trenches, which are perpendicular to the first surface of the substrate and arranged as spaced apart, wherein
- lower parts of first side surfaces and second side surfaces of the first trenches and the second trenches are respectively constituted by a second surface and a third surface of the substrate, and upper parts of first side surfaces and second side surfaces of the first trenches and the second trenches are respectively constituted by a second surface and a third surface of the first insulating layer;
- a single crystal nucleation layer is formed on a second side surface of the first trench, formed by a third surface of the substrate, and a single crystal nucleation layer is formed on a first side surface of the second trench, formed by the second surface of the substrate; and a first semiconductor layer is grown epitaxially laterally, with the single crystal nucleation layer as a nucleation center.

Optionally, herein, the single crystal nucleation layer is formed on a part of the second side surface of the first trench, and the single crystal nucleation layer is formed on a part of the first side surface of the second trench.

Optionally, herein, the first semiconductor layer is divided into a first sub-layer and a second sub-layer of the first semiconductor layer along the length direction of the trench, and a doped third semiconductor layer is also arranged between the first sub-layer and the second sub-layer.

Optionally, herein, the second surface and the third surface of the substrate are of a hexagonal symmetrical lattice structure.

Optionally, herein, the second surface and the third surface of the substrate are selected from Si (111) plane, $Al_2O_3$ (0001) plane, SiC (0001) plane, SiC (000-1) plane, GaN (0001) plane or GaN (000-1) plane.

Optionally, a second insulating layer is formed on the third bottom surfaces of the first and second trenches.

Optionally, a fourth insulating layer is respectively formed on the first side surface of the first trench and the second side surface of the second trench.

Optionally, herein, the first semiconductor layer is flush with the first insulating layer, or the first semiconductor layer has a portion protruding from the first insulating layer.

Optionally, herein, the first insulating layer, the second insulating layer and the fourth insulating layer are silicon dioxide layers.

According to one aspect of the present disclosure, a semiconductor device is provided, comprising:
- a substrate, the substrate having a first surface;
- a plurality of first trenches and second trenches, which are formed in the substrate and perpendicular to the first surface of the substrate and arranged as spaced apart;
- a second insulating layer, formed on third bottom surfaces of the plurality of first trenches and second trenches;
- a single crystal nucleation layer, formed on a second side surface in the first trench and a first side surface in the second trench;
- a first semiconductor layer, which is grown, with the single crystal nucleation layer as a nucleation center, wherein the first semiconductor layer has a first face and a second face opposite to the first face, which have a spontaneous polarization effect and a piezoelectric polarization effect, and are parallel to a first side surface and a second side surface of the trench and perpendicular to a first surface of the substrate;
- a second semiconductor layer, which is formed overlying the first semiconductor layer, wherein the forbidden band gap of the second semiconductor layer is greater than the forbidden band gap of the first semiconductor layer, so that two-dimensional electron gas and two-dimensional hole gas are respectively formed on the first face and the second face of the first semiconductor layer.

According to one aspect of the present disclosure, there is provided:
- a substrate, the substrate having a fourth surface;
- a third insulating layer, formed on the fourth surface of the substrate;
- a plurality of first trenches and second trenches, formed in the substrate and perpendicular to the fourth surface of the substrate and arranged as spaced apart;
- a second insulating layer, formed on third bottom surfaces of the plurality of first trenches and second trenches;
- a single crystal nucleation layer and a fourth insulating layer, with the single crystal nucleation layer formed on a second side surface in the first trench and a first side surface in the second trench, and the fourth insulating layer formed on the first side surface in the first trench and the second side surface in the second trench;
- a first semiconductor layer, which is in the first trench and the second trench, and protrudes from the fourth surface of the substrate, wherein the first semiconductor layer has a first face and a second face opposite to the first face, which have a spontaneous polarization effect and a piezoelectric polarization effect, are parallel to a first side surface of the first trench and a second side surface of the second trench and perpendicular to the fourth surface of the substrate and protrude from the fourth surface of the substrate; and
- a second semiconductor layer, which is formed overlying the first semiconductor layer, wherein the forbidden band gap of the second semiconductor layer is greater than the forbidden band gap of the first semiconductor layer, so that two-dimensional electron gas and two-dimensional hole gas are respectively formed on the first face and the second face of the first semiconductor layer.

According to one aspect of the present disclosure, there is provided:
- a substrate, the substrate having a first surface and a fifth surface parallel to the first surface but lower than the first surface;
- a third insulating layer, formed on the first surface and the fifth surface of the substrate;
- a plurality of first trenches and second trenches, which are formed in the substrate and perpendicular to the first surface of the substrate and arranged as spaced apart;
- a second insulating layer, formed on the third bottom surfaces of the first trenches and the second trenches;

a single crystal nucleation layer and a fourth insulating layer, with the single crystal nucleation layer formed on the second side surface in the first trench and the first side surface in the second trench, and the fourth insulating layer respectively formed on the first side surface in the first trench and the second side surface in the second trench;

a first semiconductor layer, which is in the first trench and the second trench, and protrudes from the fifth surface of the substrate, wherein the first semiconductor layer has a first face, which has a spontaneous polarization effect and a piezoelectric polarization effect, is parallel to a first side surface of the first trench and a second side surface of the second trench and perpendicular to the fifth surface of the substrate and extends upwardly;

a second semiconductor layer, which is formed overlying the first face of the first semiconductor layer, wherein the forbidden band gap of the second semiconductor layer is greater than the forbidden band gap of the first semiconductor layer, so that two-dimensional electron gas is formed on the first face of the first semiconductor layer.

According to one aspect of the present disclosure, there is provided:

a substrate, the substrate having a first surface and a sixth surface parallel to the first surface but lower than the first surface;

a third insulating layer, formed on the first surface and the sixth surface of the substrate;

a plurality of first trenches and second trenches, which are formed in the substrate and perpendicular to the first surface of the substrate and arranged as spaced apart;

a second insulating layer, formed on the third bottom surfaces of the first trenches and the second trenches;

a single crystal nucleation layer and a fourth insulating layer, with the single crystal nucleation layer formed on the second side surface in the first trench and the first side surface in the second trench, and the fourth insulating layer respectively formed on the first side surface in the first trench and the second side surface in the second trench;

a first semiconductor layer, which is in the first trench and the second trench, and protrudes from the sixth surface of the substrate, wherein the first semiconductor layer has a second face, which has a spontaneous polarization effect and a piezoelectric polarization effect, is parallel to a second side surface of the first trench and a first side surface of the second trench and perpendicular to the sixth surface of the substrate and extends upwardly; and a second semiconductor layer, which is formed overlying the second face of the first semiconductor layer, wherein the forbidden band gap of the second semiconductor layer is greater than the forbidden band gap of the first semiconductor layer, so that two-dimensional hole gas is formed on the second face of the first semiconductor layer.

Optionally, herein, the first semiconductor layer is divided into a first sub-layer of the first semiconductor layer and a second sub-layer of the second semiconductor layer along the length direction of the trenches; and a third semiconductor layer is also arranged between the first sub-layer and the second sub-layer.

Optionally, herein, the first side surface and the second side surface of the trenches are of a hexagonal symmetrical lattice structure.

Optionally, the second surface and the third surface of the substrate are selected from Si (111) plane, $Al_2O_3$ (0001) plane, SiC (0001) plane, SiC (000-1) plane, GaN (0001) plane or GaN (000-1) plane.

Optionally, herein, the third semiconductor layer is a P-type buried layer or an N-type buried layer.

Optionally, herein, a first electrode, a second electrode, and a third electrode are respectively formed on the third insulating layer, at the first face/second face of the first semiconductor layer along the length direction of the trenches, wherein the first electrode, the second electrode and the third electrode are respectively connected to the second semiconductor layer; or the first electrode and the third electrode are connected to the first semiconductor layer, and the second electrode is connected to the second semiconductor layer.

Optionally, herein, the projection of the third semiconductor layer onto the first face/second face of the first semiconductor layer is within the range of the projection of the second electrode onto the first face/second face of the first semiconductor layer, or partially overlaps with it.

Optionally, herein, the first electrode, the second electrode and the third electrode are separated from each other by a dielectric layer.

Optionally, herein, at the first face/second face opposite to the second face/first face of the first semiconductor layer where the first electrode, the second electrode, and the third electrode are located, a fourth electrode is formed on the third insulating layer, and the fourth electrode is connected to the third semiconductor layer.

Optionally, herein, the doping concentration of the third semiconductor layer is sufficient to deplete 95%-100% of the two-dimensional electron gas/two-dimensional hole gas in at least a part of the region overlapping the projection region of the second electrode, without the device bias.

Optionally, herein, the nucleation layer is formed at a position corresponding to the first electrode, or a position corresponding to the third electrode, or provided at a position corresponding to a portion between the second electrode and the third electrode.

Optionally, herein, when the nucleation layer is disposed at a position corresponding to the third electrode, a current blocking layer is formed in a direction perpendicular to the first face or the second face of the trenches.

Optionally, herein, the region corresponding to the first electrode and the region corresponding to the third electrode, of the first semiconductor layer, have the corresponding doping, so as to form the corresponding first electrode region and third electrode region.

Optionally, herein, when the HEMT device is formed, the doping of the first electrode region and the third electrode region is N-type doping; and when the HHMT device is formed, the doping of the first electrode region and the third electrode region is P-type doping.

According to another aspect of the present disclosure, an electronic device is provided.

Optionally, the electronic device is a power supply device, a mobile phone, or a power amplifier in a communication system.

BRIEF DESCRIPTION OF DRAWINGS

Hereinafter, the specific content of the present disclosure will be described with reference to the drawings, which will help to more easily understand the purposes, features, and advantages of the present disclosure. The drawings are only to illustrate the principles of the present disclosure. In the drawings, it is not necessary to draw the size and relative positions of the units according to scale. In the attached drawings.

DETAILED DESCRIPTION OF EMBODIMENTS

Figure 1:
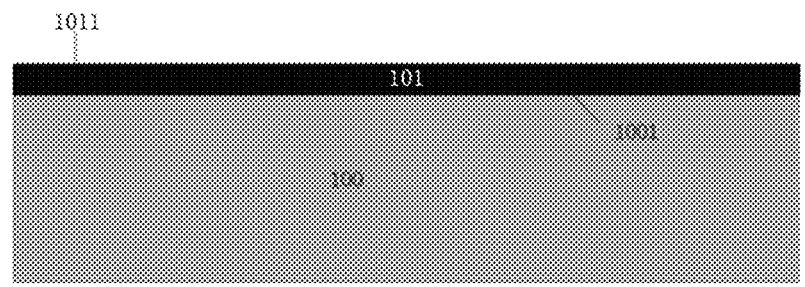
FIG. 1-10 are schematic diagrams of the structure of a semiconductor device and a manufacturing method thereof according to an embodiment.

Hereinafter, an exemplary disclosure of the present disclosure will be described with reference to the drawings. For the sake of clarity and conciseness, not all the features that realize the present disclosure are described in the specification. However, it should be understood that in the process of implementing the present disclosure, many ways to implement the present disclosure can be made in order to achieve the specific goals of the inventor, and these ways may be modified based on the present disclosure.

Here, it should also be noted that, in order to avoid the present disclosure from becoming complicated due to unnecessary details, only the device structures closely related to the technical solution according to the present disclosure are shown in the drawings, with some details omitted.

As understood, it will not happen that the present disclosure is limited to the described implementation forms due to the following description with reference to the drawings. Herein, where feasible, features may be substituted or combined between different embodiments, or one or more features may be omitted in one embodiment.

Specifically, the semiconductor device of the present disclosure is a compound semiconductor device containing a nitride semiconductor material, also referred to as a nitride semiconductor device, wherein the nitride semiconductor device is a group III nitride semiconductor device. Further, the group III nitride semiconductor device comprises a transistor using Wurtzite group III nitride semiconductor material. Furthermore, the transistor is a GaN transistor containing a GaN semiconductor material. In particular, the GaN transistor is a normally-off GaN-HEMT and/or GaN-HHMT.

A semiconductor device and a manufacturing method thereof according to an embodiment will be described with reference to FIGS. 1-10.

As shown in FIGS. 1-10, the semiconductor device comprises a substrate 100. The material of the substrate 100 can be selected according to actual needs. The present disclosure does not limit the specific material of the substrate 100, as long as the substrate material is such substrate material wherein the vertical trench, which is formed on the surface of the substrate and perpendicular to the surface of the substrate, has the side surface of a hexagonal symmetrical lattice structure. Exemplarily, the material of the substrate 100 may be Si, $Al_2O_3$, SiC, GaN, etc. Since the silicon substrate has the advantages of low cost and high processability, the Si substrate is taken as an example for further describing this disclosure.

Figure 5:
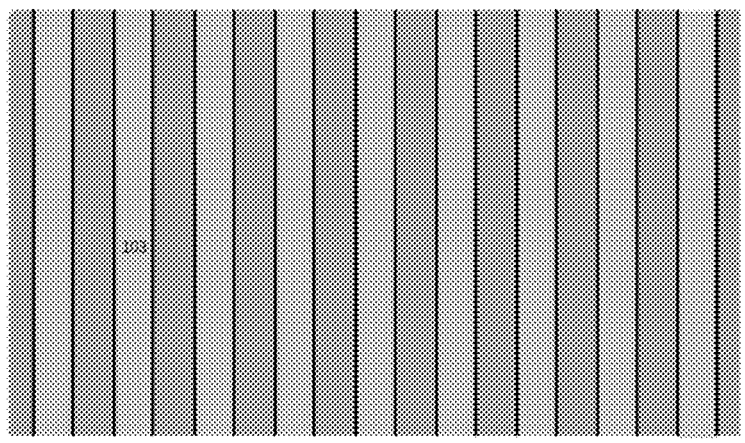
Figure 6:
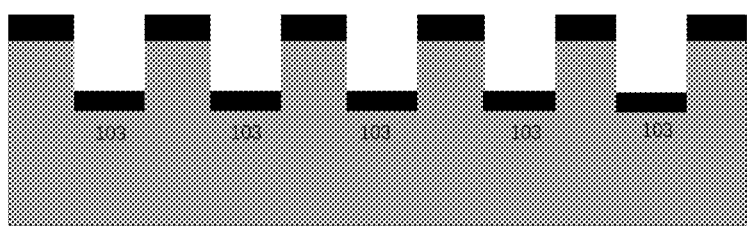
Figure 7:
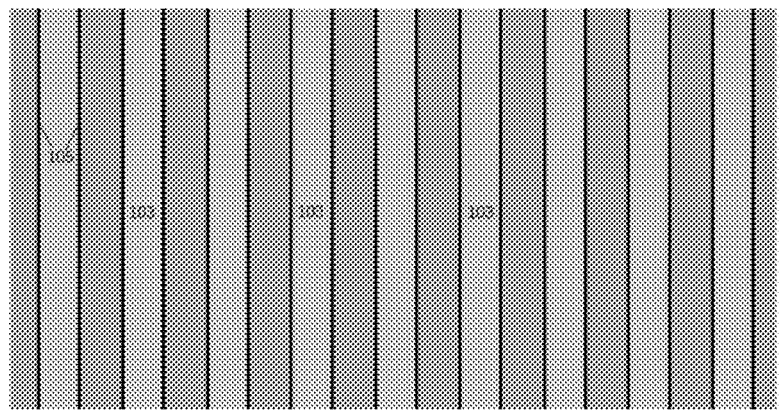
Figure 8:
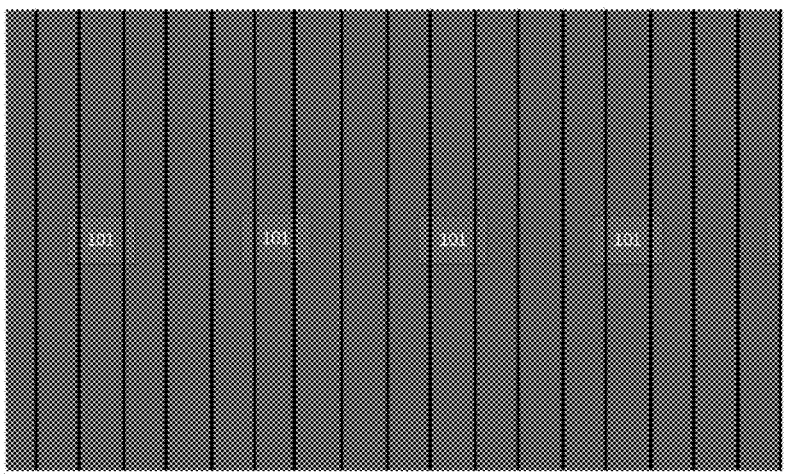
Figure 9:
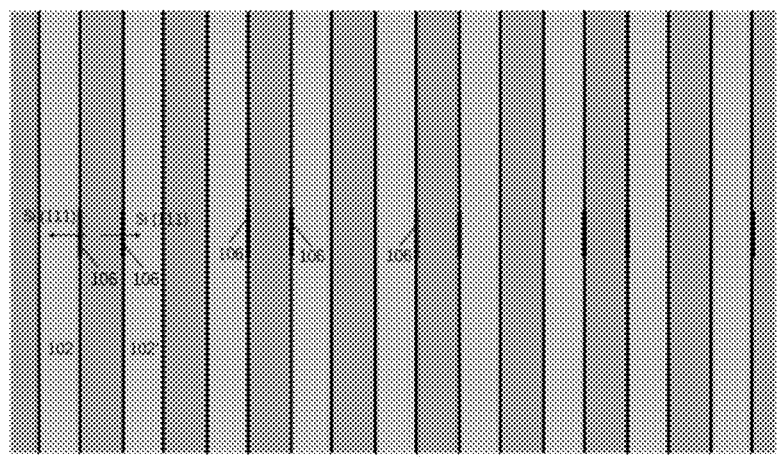
Figure 10:
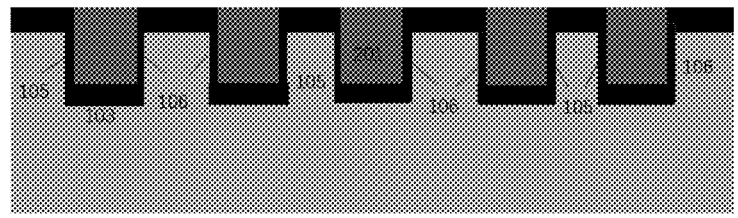

Exemplarily, a silicon substrate of (110) or (112) plane may be used as the single crystal silicon substrate. As shown in FIG. 1, a substrate 100 is provided, and the substrate has a first surface 1001; and a first insulating layer 101 is formed on the first surface 1001 of the substrate 100. Exemplarily, the first insulating layer 101 is the $SiO_2$ layer formed by thermal oxidization or vapor deposition. Exemplarily, the thickness of the first insulating layer 101 is about 0.5 micrometers. It should be noted that the numerical range in the present disclosure is only exemplary but not a limitation to the present disclosure. The first insulating layer 101 has a first surface 1011 parallel to the first surface 1001 of the substrate. A part of the first insulating layer 101 and the substrate 100 below it are etched to form a plurality of vertical trenches. Specifically, the trenches comprise first trenches 102 and second trenches 102' arranged at intervals, alternatively. The first trenches and the second trenches are the same in dimension. Exemplarily, the depth of the first trenches and the second trenches is about 5 microns. The lower parts of the first side surface 1021 and the second side surface 1022 of each trench are respectively constituted by the second surface 1002 and third surface 1003 of the substrate that are exposed, wherein the second surface 1002 and the third surface 1003 of the substrate are of hexagonal symmetrical lattice structure, such as, Si (111) plane. It is understandable that the second surface and the third surface of the substrate can also be $Al_2O_3$ (0001) plane, SiC (0001) plane, or SiC (000-1) plane, GaN (0001) plane, or GaN (000-1) plane and so on. The upper parts of the first side surface 1021 and the second side surface 1022 of each trench are respectively constituted by the second surface 1012 and the third surface 1013 of the first insulating layer 101. As shown in FIGS. 5 and 6, a second insulating layer 103 is formed on the third bottom surface 1023 of the trench. Exemplarily, the second insulating layer 103 may be a silicon dioxide layer formed by oxidation. Exemplarily, its thickness is about 500 nm. As shown in FIG. 7, a fourth insulating layer 105 is formed on the first side surface 1021 and the second side surface 1022 of the trench. Exemplarily, the thickness of the fourth insulating layer is about 100 nm. The fourth insulating layer can avoid the interaction between the silicon substrate and the Ga-containing precursor during the epitaxy, and at the same time, it is more conducive to improving the selectivity when performing the epitaxy. Further, as shown in FIGS. 8 and 9, a part of the fourth insulating layer 105 on the second side surface of the first trench and on the first side surface of the second trench is removed, and a single crystal nucleation layer 106 is formed on the third surface 1003 of the substrate 100 exposed in the first trench and on the second surface 1002 of the substrate 100 exposed in the second trench. Exemplarily, the single crystal nucleation layer is an AlN layer, the growth direction of the AlN crystal is the <0001> direction, and the surface thereof is the (0001) plane. Exemplarily, the position where the single crystal nucleation layer is located is corresponding to the position where the first electrode (source) of the subsequent device is formed. Since the semiconductor device structure can exhibit a symmetrical structure and the voltage of the first electrode region (source region) is very low when the device structure formed subsequently takes the first electrode (source) as a reference point, it is not sensitive to the crystal quality, thereby minimizing the influence of poor crystal quality in the nucleation region. Then, as shown in FIG. 10, a first semiconductor layer 201 is selectively grown with the nucleation layer 106 as the core. The first semiconductor layer 201 may be nitride, and exemplarily, such as, intrinsic GaN (i-GaN) or unintentional doped GaN layer. Due to the existence of the trenches 102, the first semiconductor layer 201 grows, starting from the nucleation layer along the trench 102, wherein the growth comprises the growth in the first direction along the trench and also comprises the growth in the second direction perpendicular to the trench. The first semiconductor layer 201 can also be grown outside the trench, and the first semiconductor layer 201 outside the trench can be removed by planarization or etching technology.

Due to the limitation of the trench 102, the first semiconductor layer can grow very straight during the lateral epitaxial growth, and further, the vertical surface of the semiconductor device, which is formed with the first semiconductor layer as a functional layer, can be formed very straight with the help of the trench. Therefore, it is easy to achieve a higher aspect ratio. More specifically, when the first semiconductor layer 201 is used as a vertical channel, the higher channel density per unit area can be achieved, thereby reducing the resistance of the device and improving the performance of the device.

The manufacturing method for manufacturing the semiconductor device will now be described in detail with reference to FIGS. 1-10, in which FIGS. 1, 2, 6, and 10 are the sectional figures, and FIGS. 3-5 and 7-9 are the top views.

Step 1: as shown in FIG. 1, a substrate 100 is provided; the substrate may be a silicon substrate with a (110) or (112) plane; a first insulating layer 101 is formed on the first surface 1001 of the substrate 100, wherein exemplarily, the first insulating layer 101 is a $SiO_2$ layer formed by thermal oxidation or vapor deposition, and exemplarily, the thickness of the first insulating layer 101 is about 0.5 micrometers.

Figure 2:
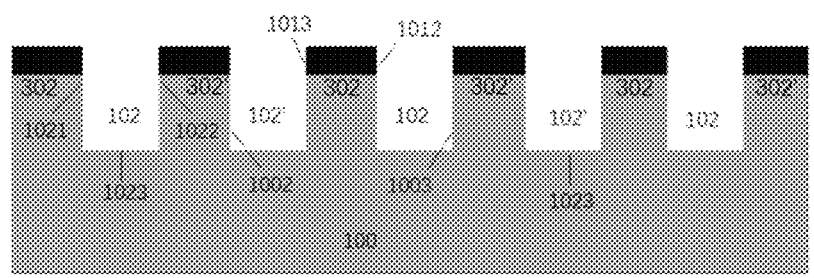

Step 2: as shown in FIG. 2, photolithography is performed on the first insulating layer 101 at intervals to expose a part of the inside of the first insulating layer 101, and then the first insulating layer 101 and the substrate 100 below it are etched at the photolithographic position to form vertical trenches which comprise first trenches 102 and second trenches 102' arranged as spaced apart, wherein the two side surfaces of each trench, that is, the first side surface 1021 and the second side surface 1022, have the lower parts which are respectively constituted by the second surface 1002 and third surface 1003 of the substrate that are exposed after the etching; the second surface 1002 and the third surface 1003 of the substrate are of a hexagonal symmetrical lattice structure, such as a Si (111) plane; and the second surface and the third surface of the substrate may also be $Al_2O_3$ (0001) surface, SiC (0001) surface, SiC (000-1) surface, GaN (0001) surface, GaN (000-1) surface, or the like.

Figure 3:
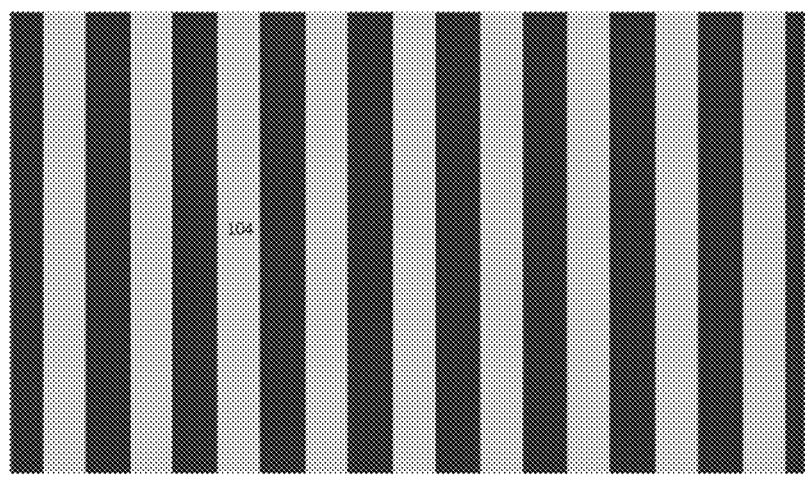

Step 3: as shown in FIG. 3, on the basis of the structure formed in Step 2, a sacrificial layer 104 is formed by conformal deposition, wherein exemplarily, the sacrificial layer 104 is a silicon nitride layer with a thickness of about 100 nanometers, wherein it is understandable that the first insulating layer and the sacrificial layer are selected as long as the both have a high etching selection ratio therebetween, wherein for example, when the sacrificial layer is etched, the etchant basically does not etch the first insulating layer or the etching is extremely slow.

Figure 4:
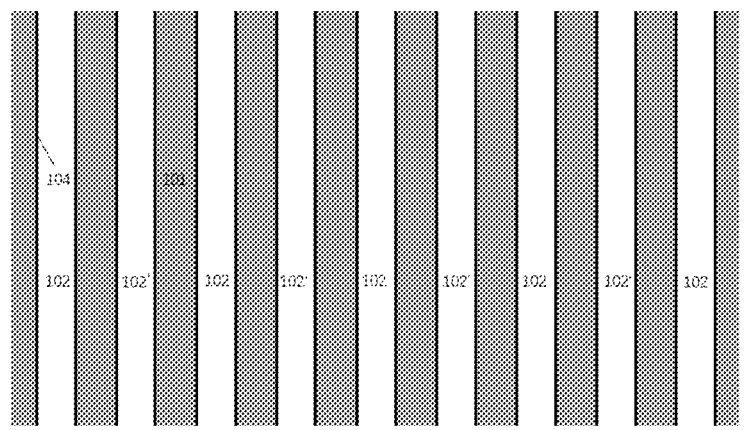

Step 4: as shown in FIG. 4, the dry etching is performed to remove the sacrificial layer 104 on the first surface 1011 of the first insulating layer 101 and the sacrificial layer 104 on the third bottom surface 1023 of the trench 102, 102', and the first sacrificial layer 104 on the first side surface 1021 and the second side surface 1022 of the trench 102 (102') are retained.

Step 5: as shown in FIG. 5, through an oxidation process, a second insulating layer 103 (silicon dioxide layer) is formed on the third bottom surface 1023 of each trench, wherein the first side surface and the second side surface of the trench are not oxidized due to the protection of the retained first sacrificial layer 104; the insulating layer can avoid the incompatibility between gallium atoms and the silicon substrate during the subsequent growth of nitride semiconductor, and avoid the phenomenon of melt-back; and at the same time, the second insulating layer can also effectively block the leakage current between the nitride semiconductor and the silicon substrate, and reduce the parasitic capacitance caused by the silicon substrate.

Step 6: as shown in FIG. 6, using the etching selection ratio of the first sacrificial layer 104 and the silicon dioxide layer, the first sacrificial layer 104 on the first side surface and the second side surface of each trench is removed by selective wet etching.

Step 7: as shown in FIG. 7, through an oxidation process, a thinner fourth insulating layer 105 (silicon dioxide layer) is formed on the first side surface and the second side surface of the trench 102, respectively, wherein the thickness of the fourth insulating layer is set differently with the thicknesses of the first and second insulating layers, so that when the fourth insulating layer is subsequently removed, the substrate can be still protected by the first and second insulating layers which are thick enough, and these insulating layers can avoid the incompatibility between gallium atoms and the silicon substrate during the subsequent growth of nitride semiconductor, and avoid the phenomenon of melt-back, which is essential for the production of gallium nitride-based semiconductor devices on the silicon substrate.

Step 8: as shown in FIG. 8, a photoresist is coated, and a photolithography pattern is formed between the first trench and the second trench to expose the (partial) first insulating layer 101 at a portion between the first trench and the second trench, wherein it can be understood that the photolithography pattern can expose the complete first insulating layer 101 between the first trench and the second trench.

Step 9: as shown in FIG. 9, the exposed fourth insulating layer 105 on the second side surface of the first trench and the first side surface of the second trench is removed, wherein because the thickness of the first insulating layer is much larger than that of the fourth insulating layer, only a small thickness of the exposed part of the first insulating layer is etched and it will not be completely removed, during the process of removing a part of the fourth insulating layer; then, the photoresist is removed, so that the third surface 1003 of the substrate 100 is exposed in the first trench partially and the second surface 1002 of the substrate 100 is exposed in the second trench partially.

Step 10: as shown in FIG. 9, due to the melt-back effect between the silicon substrate and gallium, GaN cannot be directly deposited on the silicon substrate, wherein it is usually necessary to deposit an AlN nucleation layer first, and then form the subsequent nitride semiconductor structure on this basis, and therefore, a single crystal AlN nucleation layer 106 is respectively formed on the third surface 1003 of the substrate 100 exposed in the first trench and on the second surface 1002 of the substrate 100 exposed in the second trench, wherein the growth direction of single crystal AlN crystal is <0001>, and the surface is (0001) plane, wherein it should be pointed out that the selectivity of AlN is very low, and it is easy to generate polycrystalline or amorphous AlN on the insulating layer under the normal process condition, which is unfavorable for forming the desired structure. Therefore, it is necessary to separately remove AlN on the silicon dioxide layer after the nucleation layer is formed. Alternatively, when the AlN nucleation layer is grown, a chlorine-containing gas is introduced to ensure that it grows only on the silicon substrate and not on the silicon dioxide layer.

It is understandable that if other substrates, such as $Al_2O_3$, are used, the nucleation layer may also be GaN. At this time, it is easier to achieve, through process adjustment, that the nucleation is only on the exposed substrate surface.

Step 11: as shown in FIG. 10, then, the first semiconductor layer 201 grows laterally epitaxially, with the nucleation layer 106 as the core, wherein due to the existence of the trench 102, the first semiconductor layer 201 epitaxially laterally grows along the trench 102, starting from the nucleation layer, wherein the growth comprises the growth of the first direction, which is along the trench, and also comprises the growth of the second direction, which is perpendicular to the trench; the first semiconductor layer 201 can also grow outside the trench and the first semiconductor layer 201 outside the trench can be removed by planarization or etching technology, wherein the lateral epitaxy can effectively improve the crystal quality of the nitride semiconductor in the lateral epitaxy region, thereby improving the electrical performance of the devices; the removal of the first semiconductor layer outside the trench can make the device in a constrained state during the formation process, which is conducive to the formation of a specific structure and size, helps to form a device with a higher aspect ratio, and provides a means for achieving a device with higher aspect ratio, in addition to the adjustment of growth process parameters, wherein since the growth of the first semiconductor in the trench is restricted by the first side surface and the second side surface of the trench, during the growth process of the first semiconductor layer, the situation, where it cannot be kept completely vertical or the growth surfaces are not on the same plane, is avoided, as well as the situation, where multiple complicated growth surfaces may appear, is avoided, which facilitates the control on the device and achieves the improvement of the electrical performance, wherein as understood, it is also possible that the growth of the first semiconductor layer 201 outside the trench is not removed, but forming a portion protruding from the trench.

It can be understood that, before the growth of the first semiconductor layer, a buffer layer can also be formed first by deposition.

Optionally, the structure of the first trench and the second trench can also be replaced with the corresponding first step structure 302 and second step structure 302', and then a nucleation layer is formed on a sidewall of each step structure, and an insulating layer is formed on the first surface of the substrate and the third bottom surface of the step parallel to the first surface of the substrate, and then the corresponding buffer layer and the first semiconductor layer 201 epitaxially grow, with the nucleation layer as the core, for which the previous manufacturing method may be referred to, which will not be repeated.

An optional semiconductor device and a manufacturing method are described with reference to FIGS. 11-14, which are top views.

On the basis of the foregoing content, the first insulating layer 101 and the substrate 100 on two sides of the first semiconductor layer are etched, and the first insulating layer 101 and a part of the substrate 100 are removed to expose a fourth surface 1004 of the substrate 100, so that the first semiconductor layer 201 protrudes from the fourth surface 1004 of the substrate 100 after etching. The first semiconductor layer 201 has the first face 2013 with spontaneous polarization effect and piezoelectric polarization effect and the second face 2014 with spontaneous polarization effect and piezoelectric polarization effect, opposite to the first face. When the first semiconductor layer is GaN, the first face 2013 is the (0001) face, and the second face 2014 is the (000-1) face. A third insulating layer 107 is formed on the substrate 100 after etching, to isolate the exposed silicon substrate. Exemplarily, the third insulating layer may be a silicon dioxide layer. Then a second semiconductor layer 202 is formed in a way of covering the first semiconductor layer 201. The second semiconductor layer may be an AlN layer or an AlGaN layer, and then two-dimensional electron gas 2DEG and two-dimensional hole gas 2DHG are formed respectively on the first face 2013 and the second face 2014 of the first semiconductor layer.

Then, a first electrode 401, a second electrode 402, and a third electrode 403 are respectively formed on the second semiconductor layer 202, in a direction along the length of the trench. Optionally, the first electrode is a source, the second electrode is a gate, and the third electrode is a drain. The first electrode and the third electrode may also be formed on the first semiconductor layer 201 along the transmission direction of the two-dimensional electron gas.

Herein, the first electrode to the third electrode are all formed on the surface of the third insulating layer of the substrate 100, so that while the structure of the semiconductor device has a vertical channel, the arrangement of the electrodes is particularly suitable for the planarization process, which is beneficial to improve the integration density of semiconductor devices.

The manufacturing method for manufacturing the semiconductor device is exemplarily described below. The above-mentioned manufacturing method may further comprise the following steps.

Figure 11A:
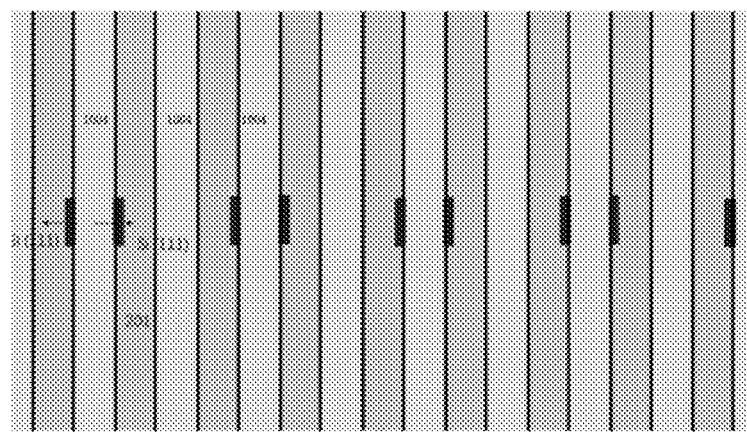
FIG. 11a-14 are schematic diagrams of the structure of the optional semiconductor device and manufacturing methods thereof.

Step 12: as shown in FIG. 11a, a photolithography pattern is formed to expose the entire region between the adjacent first trench and second trench from above, and the material of the first insulating layer 101 and a part of the substrate 100 in the region are etched, such that the first semiconductor layer covered by the fourth insulating layer, in the trench 102, protrudes from the fourth surface 1004 of the substrate after etching.

Figure 12:
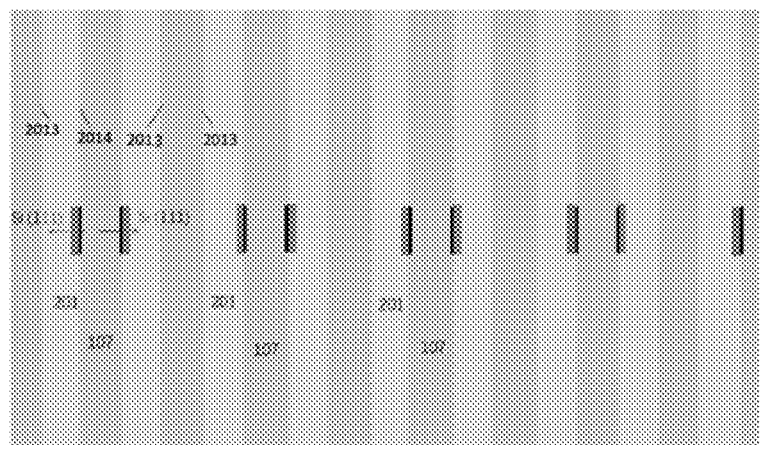

Step 13: as shown in FIG. 12, a third insulating layer 107 is formed on the fourth surface 1004 of the substrate 100 after etching, wherein exemplarily, the third insulating layer may be a silicon dioxide layer formed by oxidation, and then the fourth insulating layer covering the first semiconductor layer 201 is removed, thereby exposing the first face 2013 and the second face 2014 of the first semiconductor layer 201, which have the spontaneous polarization effect and the piezoelectric polarization effect, with the second face opposite to the first face.

Figure 13:
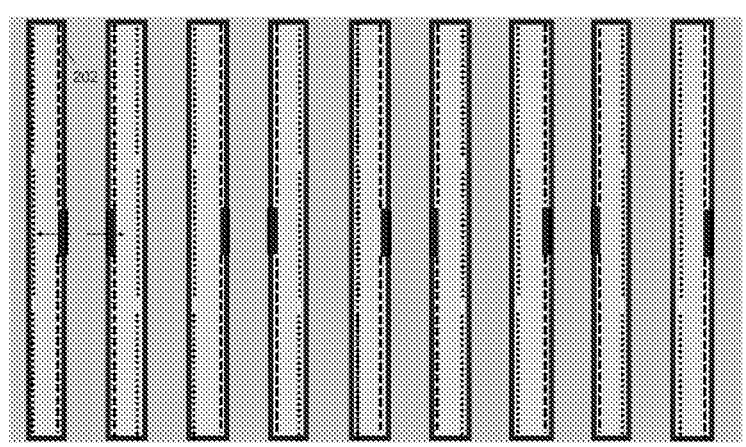

Step 14: as shown in FIG. 13, a second semiconductor layer 202 is formed overlying the first semiconductor layer 201, wherein the second semiconductor layer may be an AlN layer or an AlGaN layer, and further two-dimensional electron gas 2DEG and two-dimensional hole gas 2DHG are respectively formed on the first face 2013 and the second face 2014 of the first semiconductor layer.

It is understandable that a plurality of stack structures, which are composed of the first semiconductor layers and the second semiconductor layers alternately, can be continuously formed, covering on the second semiconductor layer, so as to further form a plurality of multi-channel structures composed of two-dimensional electron gas 2DEG and two-dimensional hole gas 2DHG.

Figure 14:
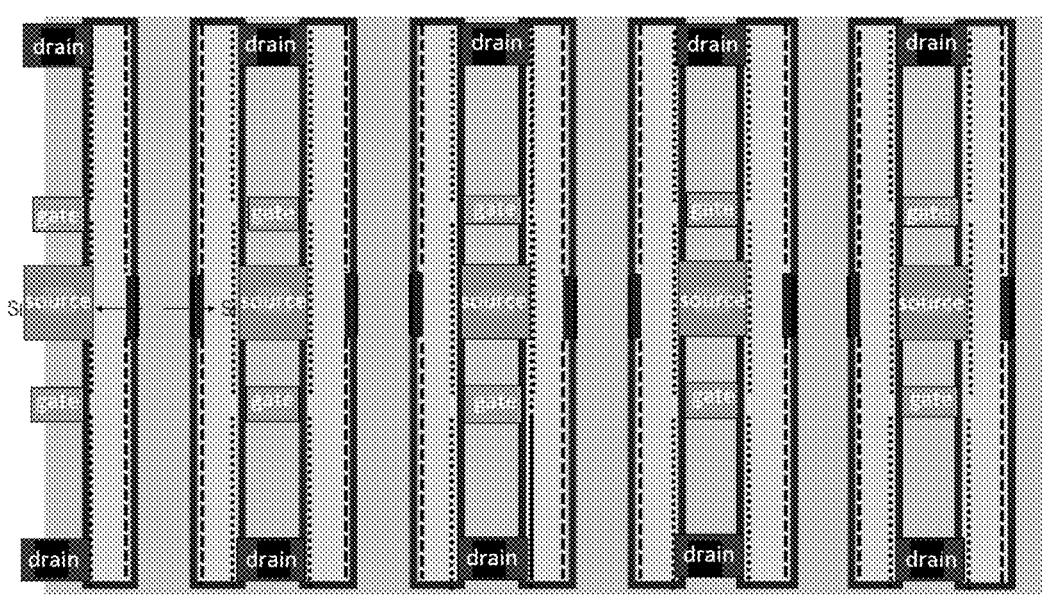

Step 15: As shown in FIG. 14, a dielectric layer is deposited, the first dielectric layer is lithographically etched, and then metal is deposited thereon, so that a first electrode and a third electrode are respectively formed on the first face of the first semiconductor layer 201 along the transmission direction of the two-dimensional electron gas, and a second electrode is formed on the second semiconductor layer 202 along the transmission direction of two-dimensional electron gas, wherein the second electrode is located between the first electrode and the third electrode, and optionally, the first electrode is a source, the second electrode is a gate, and the third electrode is a drain, and optionally, the first to third electrodes are all formed on the second semiconductor layer 202 along the transmission direction of the two-dimensional electron gas.

An optional semiconductor device and a manufacturing method thereof are described with reference to FIGS. 15-17, which are top views.

Optionally, a first sub-layer 2011 of a first semiconductor, a third semiconductor 203 and a second sub-layer 2012 of the first semiconductor are formed in the trench along the direction of the first side surface and the second side surface of the channel. The first sub-layer, the third semiconductor 203 and the second sub-layer completely fill the trench, so that the layers are each parallel to the first surface of the first semiconductor and coplanar with each other. It can be understood that the third semiconductor layer has P-type doping or N-type doping. Exemplarily, the P-type doping is P-type GaN, and the N-type doping is N-type GaN. Exemplarily, the doping concentration is 1E17-5E19/cm$^3$, more preferably 1E+18/cm$^3$-5E+19/cm$^3$. The P-type GaN layer can deplete the two-dimensional electron gas on the first face of the first semiconductor layer; and the N-type GaN layer can deplete the two-dimensional hole gas on the second face of the first semiconductor layer, so that the device has a normally-off state. The selection of P-type doping or N-type doping depends on the specific type of subsequent devices. For HEMT devices, P-type doping is selected, and for HHMT devices, N-type doping is selected. It is understandable that the doping can be gradual (gradually varied). The rest of the structural features are the same as the above-mentioned embodiments, and will not be repeated here. The projection of the third semiconductor onto the first face of the first semiconductor is within the range of the projection of the second electrode in this direction, or partially overlaps with projection of the second electrode in this direction. The parameters of the third semiconductor layer, such as the doping concentration and size, can be set according to the device parameters, as long as it can deplete 95%-100% of the two-dimensional electron gas or two-dimensional hole gas, wherein along with the concentration of two-dimensional charge carrier gas being higher, the corresponding doping concentration can be increased accordingly.

The manufacturing method for the optional semiconductor device is specifically described below.

Figure 15:
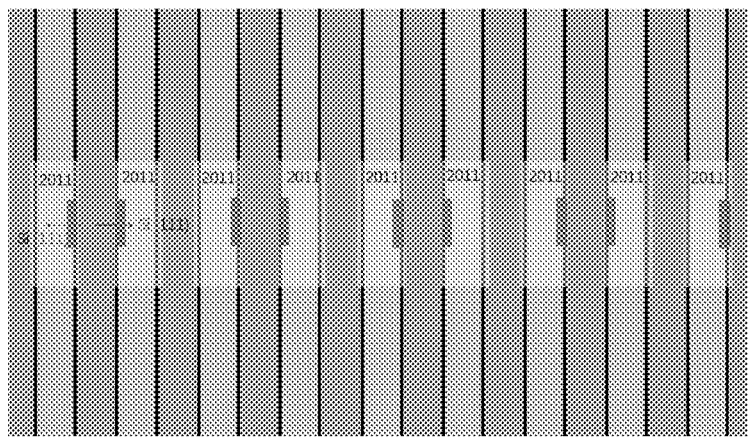
FIG. 15-17 are schematic diagrams of the structure of the optional semiconductor device and manufacturing methods thereof.
Figure 16:
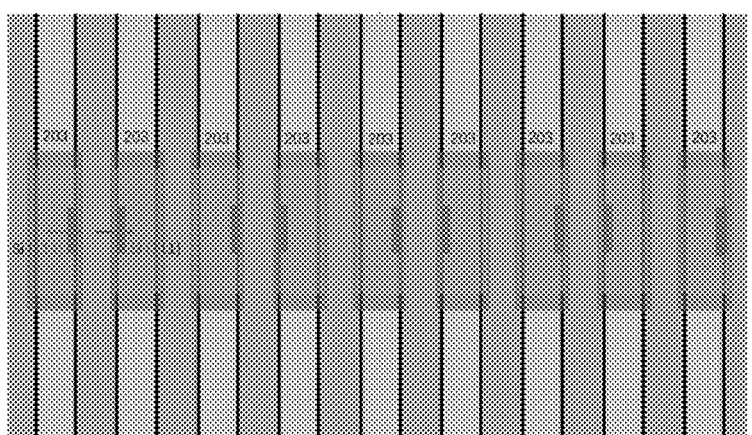
Figure 17:
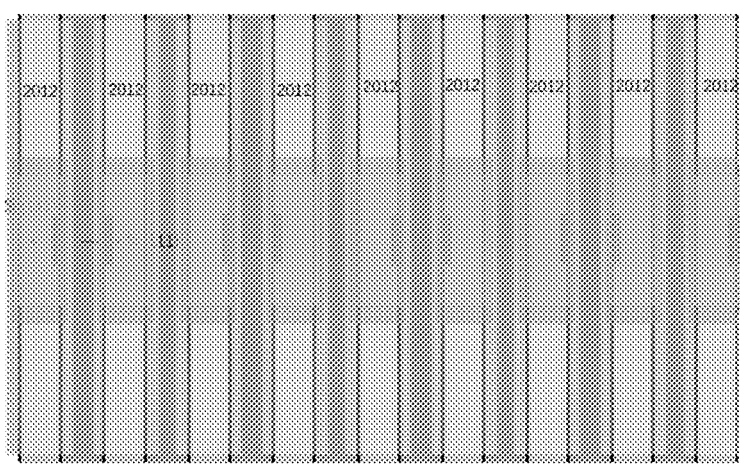

Step 11': as shown in FIGS. 15-17, after the nucleation layer 106 is formed, the first sub-layer 2011 of the first semiconductor is selectively grown with the nucleation layer 106 as the core. Due to the existence of the trench 102, the first sub-layer 2011 grows epitaxially laterally along the trench 102, starting from the nucleation layer, wherein the growth comprises the growth of the first direction, along the first side surface or the second side surface of the trench, and the growth perpendicular to the third bottom surface of the trench. Then, with the first sub-layer 2011 as the core, a doped third semiconductor layer 203 is grown. The growth of the third semiconductor layer 203 also comprises the growth of the first direction, along the first side surface or the second side surface of the trench, and also comprises the growth of the second direction, perpendicular to the first side surface or second side surface of the trench, and the growth perpendicular to the third bottom surface of the trench. The third semiconductor layer 203 is located within the projection range of the gate in the projection direction of the subsequent device, or partially overlaps the projection of the gate in this direction.

Then, with the third semiconductor layer 203 as the core, the second sub-layer 2012 of the first semiconductor layer is continued to grow. The second sub-layer of the first semiconductor layer may also be an intrinsic GaN layer or an unintentionally doped GaN layer. The growth direction of the second sub-layer 2012 of the first semiconductor layer is the same as the growth direction of the first sub-layer or the third semiconductor layer. Finally, the parts of the first sub-layer, the third semiconductor, and the second sub-layer that grow perpendicular to the third bottom surface of the trench and are located outside the trench are removed by planarization or etching technique, so that the first sub-layer, the third semiconductor layer and the second sub-layer are all located in the trench, forming a coplanar structure. The coplanar structure can make the device in a constrained state during the formation process, which is conducive to the formation of a specific structure and size, helps to form a device with a higher aspect ratio, and provides a means for achieving a device with higher aspect ratio, in addition to the adjustment of growth process parameters, wherein since the growth of the first semiconductor and the third semiconductor in the trench is restricted by the first side surface and the second side surface of the trench, during the growth process of the first semiconductor layer and the third semiconductor, the situation, where it cannot be kept completely vertical or the growth surfaces are not on the same plane, is avoided, as well as the situation, where multiple complicated growth surfaces may appear, is avoided, which facilitates the control on the device and achieves the improvement of the electrical performance.

Of course, it can be understood that part of the first sub-layer, the third semiconductor layer and the second sub-layer may also be made to be located outside the trench.

Figure 18:
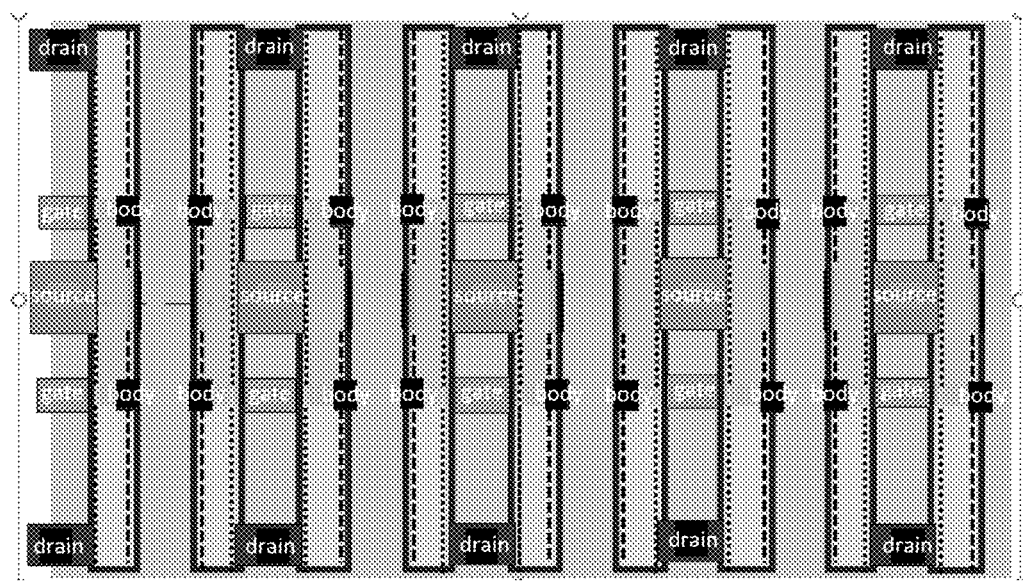
FIG. 18 is a schematic diagram of the structure of an optional semiconductor device and manufacturing method thereof.

An optional semiconductor device and a manufacturing method thereof will be described with reference to FIG. 18, which is a top view.

Optionally, on the basis of the foregoing content, a fourth electrode 404 is formed on the face of the first semiconductor layer 201 in the transmission direction of the two-dimensional hole gas, that is, in the direction facing away from the transmission direction of the two-dimensional electron gas. The fourth electrode is a body electrode for contacting with the third semiconductor layer 203, so as to better control the threshold voltage. It can be understood that the fourth electrode can also be formed on the fourth surface of the substrate. The position and forming method of the fourth electrode are not specifically limited here, as long as it can contact with the third semiconductor.

Figure 11B:
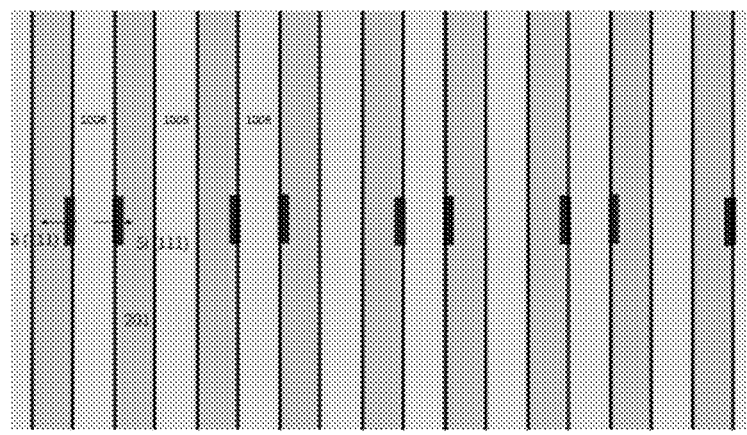

Optionally, the first insulating layer 101 and the substrate 100 on one side of the first semiconductor layer where the first face 2013 is located are etched to remove the first insulating layer 101 and a part of the substrate 100 to expose a fifth surface 1005 of the substrate 100, so that the substrate has a first surface 1001 and the fifth surface 1005 (as shown in FIG. 11b) that is lower than and parallel to the first surface 1001. The first face 2013 of the first semiconductor layer 201 having the spontaneous polarization effect and the piezoelectric polarization effect is exposed. When the first semiconductor layer is GaN, the first face 2013 is the (0001) face. At this time, the second face 2014 opposite to the first face 2013, with spontaneous polarization effect and piezoelectric polarization effect, is still covered by the substrate and the first insulating layer, and the second face 2014 is the (000-1) face of GaN. A third insulating layer 107 is formed on the substrate 100 after etching, to isolate the exposed silicon substrate. Exemplarily, the third insulating layer may be a silicon dioxide layer. Then a second semiconductor layer 202 is formed on the first face 2013 of the first semiconductor layer 201. The second semiconductor layer is an AlN layer or an AlGaN layer, thereby forming a two-dimensional electron gas 2DEG on the first face 2013 of the first semiconductor layer. It can be understood that the first semiconductor layer and the second layer may form a plurality of alternate stack structures, to form a HEMT device with a plurality of multi-channel structures of two-dimensional electron gas 2DEG.

The manufacturing method for manufacturing the semiconductor device will now be exemplarily described with reference to FIGS. 19-21 in conjunction with the foregoing manufacturing method.

Figure 19:
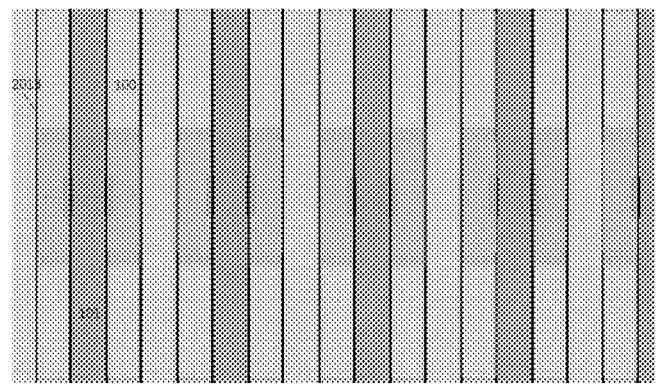
FIG. 19-21 are schematic diagrams of the structure of an optional semiconductor device and manufacturing methods thereof.

Step 12', as shown in FIG. 19, a photolithography pattern is formed to expose the region on side of the first face 2013 of the first semiconductor layer, and the first insulating layer 101 and a part of the substrate 100 in the region are etched to expose the fourth insulating layer on the side of the first face of the first semiconductor layer 201, with spontaneous polarization effect and piezoelectric polarization effect. The second face 2014 opposite to the first face 2013, with the spontaneous polarization effect and the piezoelectric polarization effect, is still surrounded by the fourth insulating layer, the substrate, and the first insulating layer.

Figure 20:
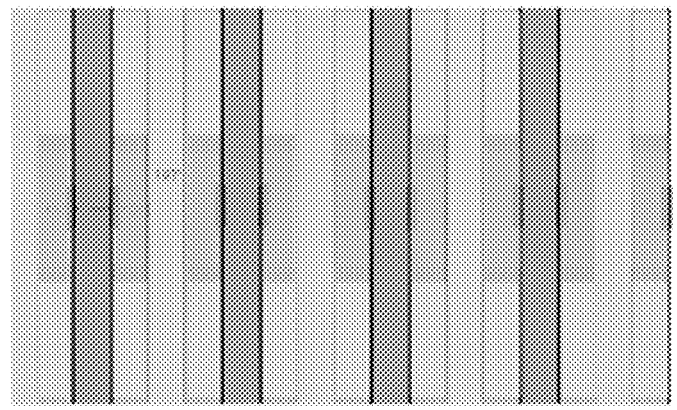

Step 13', as shown in FIG. 20, a third insulating layer 107' is formed on the substrate 100 after etching. Exemplarily, the third insulating layer may be a silicon dioxide layer formed by oxidation. In the case of isolating the exposed silicon substrate by the third insulating layer, the fourth insulating layer covering the first face 2013 of the first semiconductor layer 201 is removed.

Figure 21:
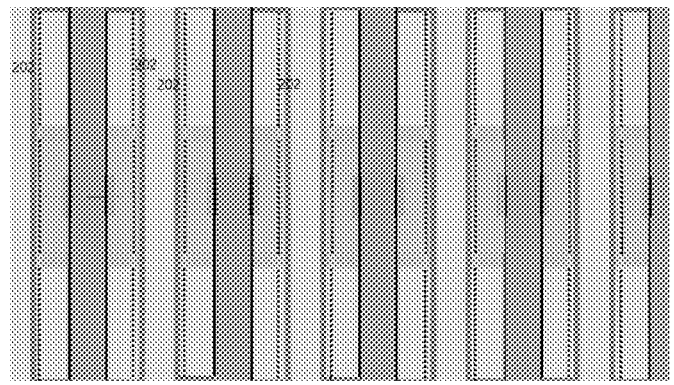

Step 14', as shown in FIG. 21, a second semiconductor layer 202 is formed, by chemical deposition, on the first face 2013 of the first semiconductor layer 201. The second semiconductor layer can be an AlN layer or an AlGaN layer, so that the two-dimensional electron gas 2DEG can be formed on the first face 2013 of the first semiconductor layer.

Optionally, the first insulating layer 101 and the substrate 100 on only one side of the first semiconductor layer where the second face 2014 is located are etched to remove the first insulating layer 101 and part of the substrate 100 to expose a sixth surface 1006 of the substrate 100, so that the substrate has a first surface 1001 and the sixth surface 1006 (as shown in FIG. 11b) that is lower than and parallel to the first surface 1001. The second face 2014 having the spontaneous polarization effect and the piezoelectric polarization effect, of the first semiconductor layer 201, is exposed. When the first semiconductor layer is GaN, the second face 2014 is the (000-1) face. At this time, the first face 2013 with spontaneous polarization effect and piezoelectric polarization effect, opposite to the second face 2014, is still covered by the substrate and the first insulating layer, and the first face 2013 is the (0001) face of GaN. A third insulating layer 107 is formed on the substrate 100 after etching, to isolate the exposed silicon substrate. Exemplarily, the third insulating layer may be a silicon dioxide layer formed by oxidation. Then, a second semiconductor layer 202 is formed to cover the second face 2014 of the first semiconductor layer 201. The second semiconductor layer is an AlN layer or an AlGaN layer, thereby forming two-dimensional hole gas 2DHG on the second face 2014 of the first semiconductor layer. It can be understood that the first semiconductor layer and the second semiconductor layer may form a plurality of alternate stack structures, thereby forming an HHMT device with a plurality of channel structures of two-dimensional hole gas 2DHG.

The manufacturing method for manufacturing the semiconductor device will now be exemplarily described with reference to FIGS. 22-24, in conjunction with the foregoing manufacturing method.

Figure 22:
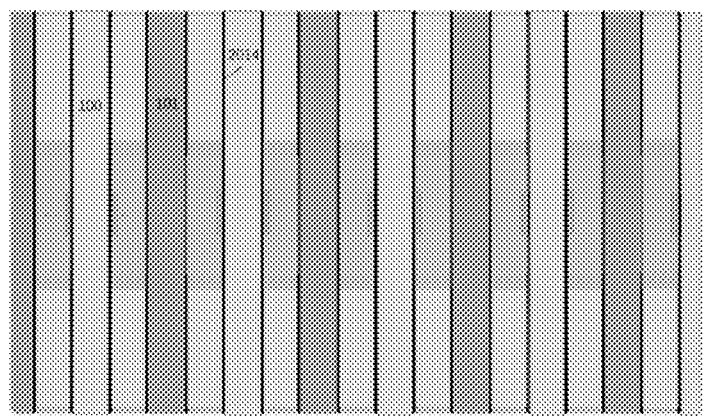
FIG. 22-24 are schematic diagrams of the structure of an optional semiconductor device and manufacturing methods thereof.

Step 12', as shown in FIG. 22, a photolithography pattern is formed to expose the region on the side of the second face 2014 of the first semiconductor layer, and the material of the first insulating layer 101 and a part of the substrate 100 in the region are etched to expose the fourth insulating layer on the side of the second face 2014 of the first semiconductor layer 201, having the spontaneous polarization effect and the piezoelectric polarization effect. The first face 2013, with spontaneous polarization effect and piezoelectric polarization effect, opposite to the second face 2014, is still surrounded by the fourth insulating layer, the substrate and the first insulating layer.

Figure 23:
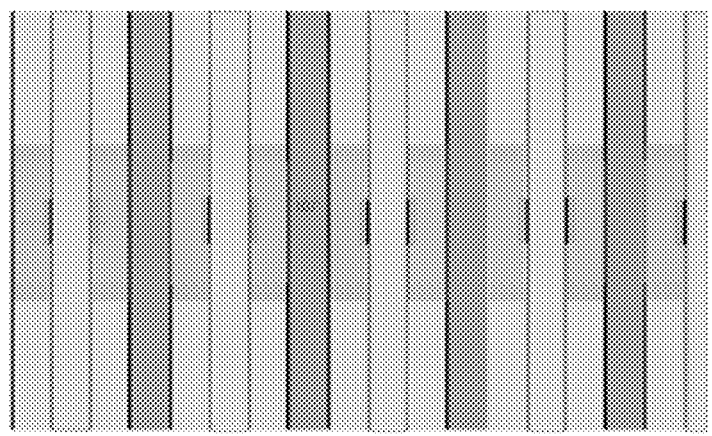

Step 13', as shown in FIG. 23, a third insulating layer 107' is formed on the substrate 100 after etching. Exemplarily, the third insulating layer may be a silicon dioxide layer formed by oxidation. In the case where the exposed silicon substrate is isolated by the third insulating layer, the fourth insulating layer covering the second face 2014 of the first semiconductor layer 201 is removed.

Figure 24:
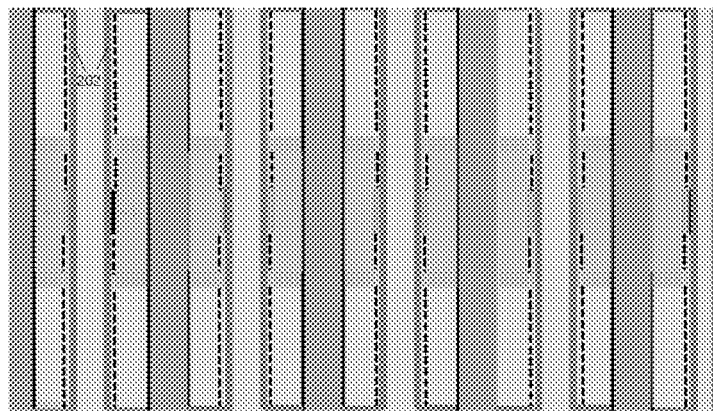

Step 14', as shown in FIG. 24, the second face 2014 of the first semiconductor layer 201 is covered by a second semiconductor layer 202, which is formed by chemical deposition. The second semiconductor layer can be an AlN layer or an AlGaN layer, so that two-dimensional hole gas 2DHG is formed on the second face 2014 of the first semiconductor layer.

It is understandable that, in some embodiments, the manner of forming the photolithographic pattern may be changed. All the regions between adjacent first trenches and second trenches are exposed from above, and the first insulating layer 101 and a part of the substrate 100 in these regions are etched, so that the first semiconductor layer covered by the fourth insulating layer, in the trench 102, protrudes from the fourth surface of the substrate after etching, and then only the region on the side of the first face/the second face of the first semiconductor layer is further etched to expose the fifth surface 1005 or the sixth surface 1006 of the substrate, the specific method of which may be obtained by referring to the foregoing content, which will not be repeated here.

Optionally, the position where the single crystal nucleation layer is located corresponds to the position where the third electrode (drain) of the subsequent device is formed. At this time, in order to avoid problems of, such as, poor crystal quality and large leakage current in the nucleation region, a current blocking layer may be added onto the single crystal nucleation layer. The current blocking layer, for example, may be heavily doped with C or Fe elements, and the doping range of C or Fe may be $1E17$-$1E20/cm^3$.

Optionally, the position of the single crystal nucleation layer may also be arranged in the region between the second electrode and the third electrode. Exemplarily, the above technical problems can be overcome by separating, by a certain distance, the position where the nucleation layer is located, from the position where the subsequent drain electrode region is located.

Optionally, for the region where the single crystal nucleation layer is provided, the regions of the corresponding first and second trenches may be exposed by photolithography.

The current blocking layer can be formed by performing corresponding doping during epitaxial growth with a single crystal nucleation layer as the core.

Optionally, doping is performed in the first electrode region (source region) and the third electrode region (drain region) to reduce the contact resistance. It is understandable that when forming HEMT devices, the doping type of the source and drain regions is N-type; and when forming HHMT devices, the doping type of the source and drain regions is P-type.

Optionally, in the HEMT device, the second semiconductor layer can be removed so that the first electrode and/or the third electrode are in physical contact with the first semiconductor layer, and form an ohmic contact with the two-dimensional electron carrier gas (2DEG). Due to the existence of the doped first electrode region and third electrode region, such direct physical contact with the first semiconductor layer is more conducive to reducing the ohmic contact resistance, through the design of the process and the structure.

Optionally, in the HHMT device, since the P-type ohmic contact is more difficult to be formed, when the second semiconductor layer is removed so as to make the first electrode (and/or the third electrode) in physical contact with the first semiconductor layer and form an ohmic contact with the two-dimensional hole carrier gas (2DHG), due to the existence of the doped first electrode and third electrode regions, through the design of the process and structure, this method of being the direct physical contact with the first semiconductor layer is more conducive to reducing ohmic contact resistance.

The manufacturing method for manufacturing the semiconductor device will now be exemplarily described with reference to FIGS. 25-28 in conjunction with the foregoing manufacturing method.

Figure 25:
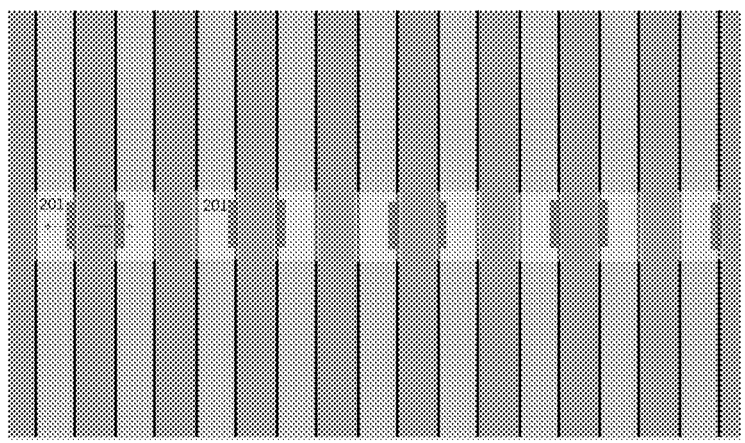
FIG. 25-28 are schematic diagrams of the structure of an optional semiconductor device and manufacturing methods thereof.

The doping of the source region and the drain region are illustrated, with the example where the nucleation layer corresponds to the source region. The case where the nucleation layer corresponds to the drain region, or the case where the nucleation layer is located between the gate region and the drain region is similar to the case where the nucleation layer corresponds to the source region, which will not be repeated here. As shown in FIG. 25, after the nucleation layer is formed, during the growth process of the first semiconductor layer 201 with the nucleation layer as the core, corresponding P-type or N-type doping is performed in the source region.

Optionally, during the growth process of the first semiconductor layer 201 with the nucleation layer as the core, before the corresponding doping, the intrinsic (undoped) first semiconductor layer, or unintentionally doped first semiconductor layer grows, and then the doped source region grows.

Figure 26:
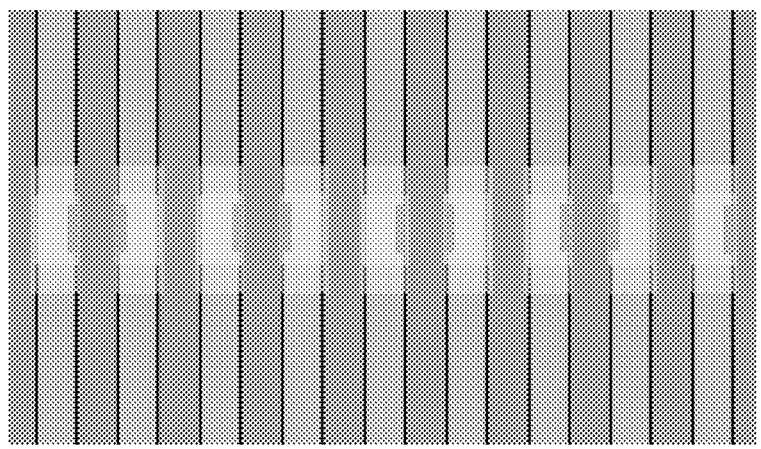
Figure 27:
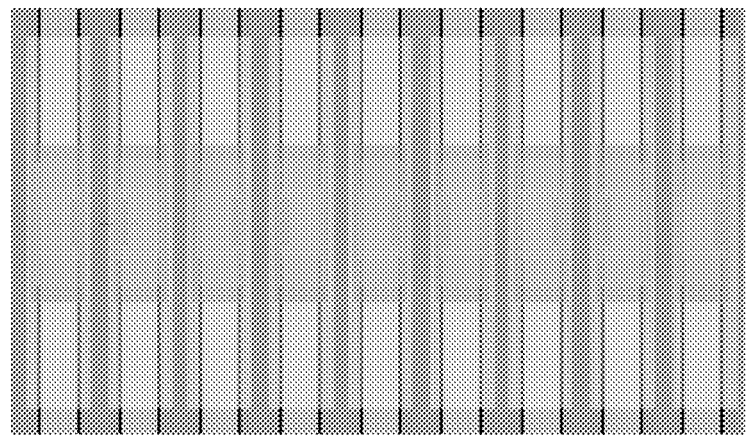

Next, as shown in FIGS. 26-27, after the doped source region is formed, the intrinsic first semiconductor layer or the unintentionally doped first semiconductor layer is epitaxially grown to form the channel region. It can be understood that the channel region corresponding to the second electrode can be selectively doped to form the third semiconductor layer.

Figure 28:
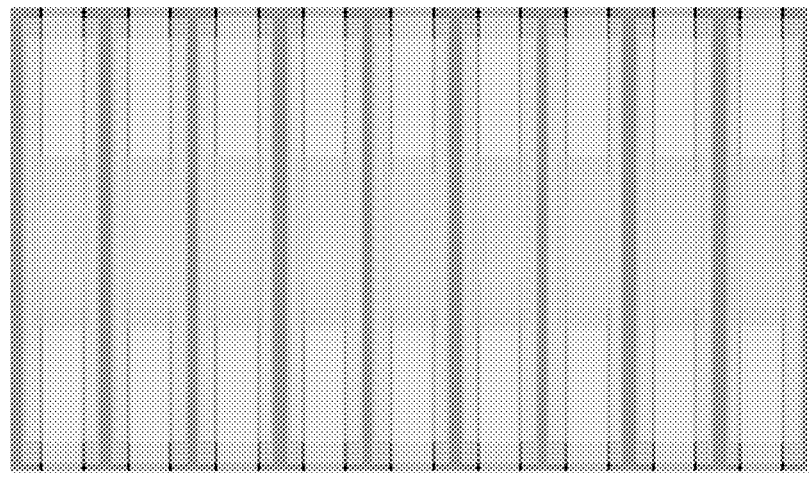
Figure 29:
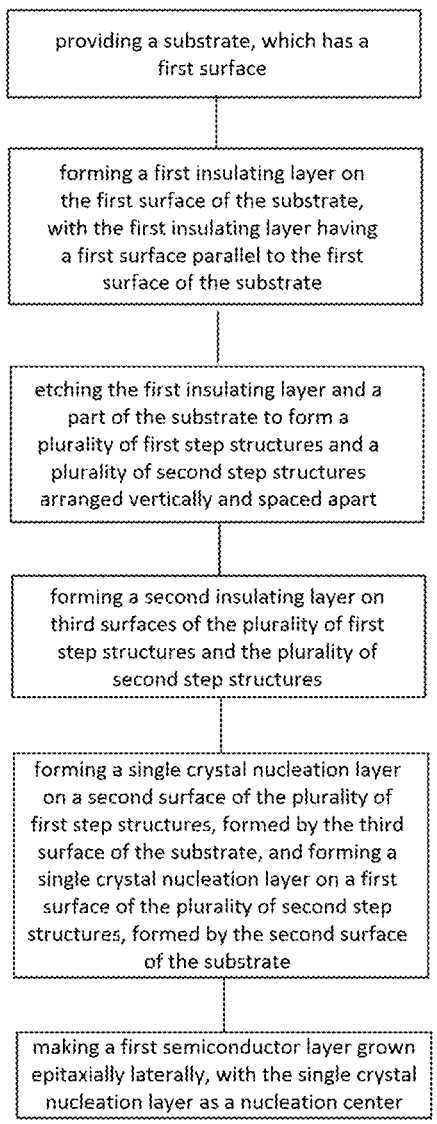
FIG. 29 is a schematic diagram of an optional manufacturing method for a semiconductor device.
Figure 30:
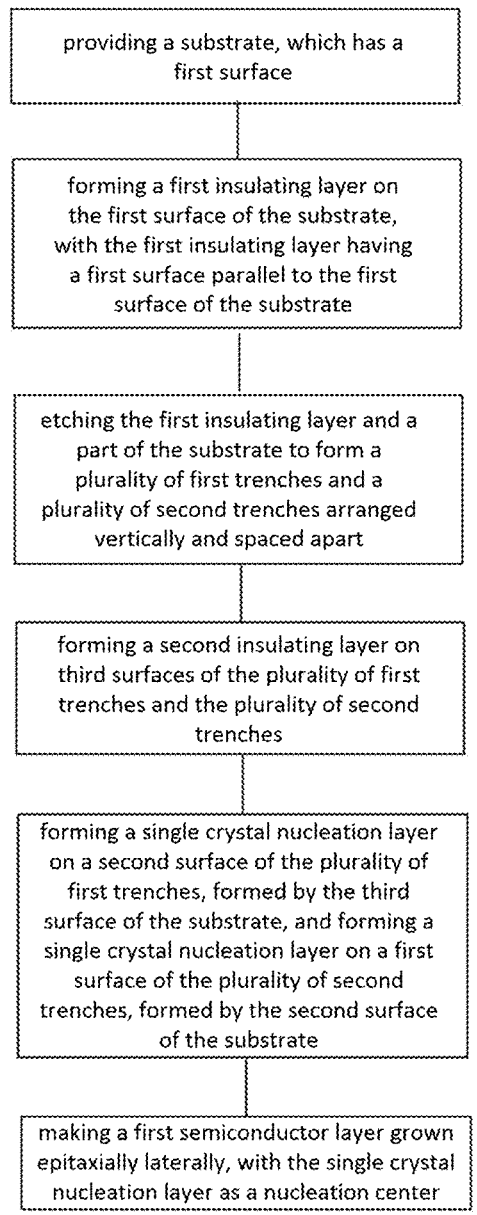
FIG. 30 is a schematic diagram of an optional manufacturing method for a semiconductor device.

Then, as shown in FIG. 28, during the epitaxial growth of the first semiconductor layer in the subsequent step, corresponding P-type or N-type doping may be performed in the drain region.

It is understandable that, herein, the doping of the drain region and the source region may be performed simultaneously with the doping of the third semiconductor layer, or the doping of the drain region, the doping of the source region, and the doping of the third semiconductor layer may be carried out successively.

A power supply device comprises any one of the above-mentioned semiconductor devices. The power supply device comprises a primary circuit, a secondary circuit, transformer, etc., wherein both the primary circuit and the secondary circuit have a switching element, wherein the switching element uses any one of the above-mentioned semiconductor devices.

A mobile phone comprises any one of the above-mentioned semiconductor devices. The mobile phone comprises a display screen, a charging unit, etc., wherein the charging unit comprises any one of the above-mentioned semiconductor devices.

An amplifier is provided, with the amplifier being a power amplifier capable of being in the fields of mobile phone base stations, optical communication systems, and the like. The power amplifier can comprise any one of the above-mentioned semiconductor devices.

The technical solutions of the present disclosure can at least help to achieve one of the following effects that: the semiconductor device can reduce the gate leakage current, has high threshold voltage, high power, and high reliability, and achieve the low on-resistance and the normally-off state of devices, and provide a stable threshold voltage, so that the semiconductor device has good switching characteristics.

The technical solutions of the present disclosure can also help to achieve one of the following effects that: it is easy to achieve a higher aspect ratio; it can achieve a higher channel density per unit area; it is suitable for a planarization process and beneficial to increase the integration density of semiconductor devices; and the structure and preparation process of the semiconductor devices are relatively simple, which can effectively reduce the production cost.

The present disclosure has been described above in conjunction with embodiments, but it should be clear for those skilled in the art that these descriptions are exemplary and do not limit the scope of protection of the present disclosure. Those skilled in the art can make various variations and modifications to the present disclosure according to the spirit and principle of the present disclosure, and these variations and modifications are also within the scope of the present disclosure.

INDUSTRIAL APPLICABILITY

The present disclosure provides a novel semiconductor device structure and manufacturing method thereof, which has simple process, low cost, and higher aspect ratio, and can achieve the higher channel density per unit area, and an energy-saving semiconductor device with high performances, such as high withstand voltage, high power, low on-resistance, etc.

What is claimed is:

1. A manufacturing method for a semiconductor device, comprising:
   Step 1: providing a substrate, which has a first surface;
   Step 2: forming a first insulating layer on the first surface of the substrate, with the first insulating layer having a first surface parallel to the first surface of the substrate;
   Step 3: etching the first insulating layer and a part of the substrate to form a plurality of first step structures and a plurality of second step structures arranged vertically and spaced apart, wherein a lower part of a first side surface of the plurality of first step structures and a lower part of a second side surface of the plurality of second step structures are respectively constituted by a second surface and a third surface of the substrate, and an upper part of the first side surface of the plurality of first step structures and an upper part of the second side surface of the plurality of second step structures are respectively constituted by a second surface and a third surface of the first insulating layer;
   Step 4: forming a second insulating layer on third bottom surfaces of the plurality of first step structures and the plurality of second step structures; wherein each third bottom surface is constituted by a surface of the substrate located between a first step structure and a second step structure;
   Step 5: forming a single crystal nucleation layer on a second side surface of the plurality of first step structures, formed by the third surface of the substrate, and forming a single crystal nucleation layer on a first side surface of the plurality of second step structures, formed by the second surface of the substrate; and
   Step 6: making a first sub-layer of a first semiconductor layer grown epitaxially laterally, with the single crystal nucleation layer as a nucleation center, and then a third semiconductor layer grown with the first sub-layer as a core, and then further a second sub-layer of the first semiconductor layer grown with the third semiconductor layer as a core; wherein
   the first semiconductor layer has a first face and a second face opposite to the first face, which have a spontaneous polarization effect and a piezoelectric polarization effect, and are parallel to the first side surface and the second side surface of the first step structures and the second step structures and perpendicular to the first surface of the substrate; and
   the third semiconductor layer is N-type doped or P-type doped, and a projection of the third semiconductor layer onto the first face or the second face of the first semiconductor layer is configured to be within a range of, or partially overlaps with a projection of a gate onto the first face or the second face of the first semiconductor layer.

2. The method according to claim 1, wherein the second surface and the third surface of the substrate are of a hexagonal symmetrical lattice structure.

3. The method according to claim 2, wherein in Step 5, the single crystal nucleation layer is formed on a part of the second side surface of the plurality of first step structures, formed by the third surface of the substrate, and the single crystal nucleation layer is formed on a part of the first side surface of the plurality of second step structures, formed by the second surface of the substrate.

4. A manufacturing method for a semiconductor device, comprising:
   Step 1: providing a substrate, which has a first surface;
   Step 2: forming a first insulating layer on the first surface of the substrate, with the first insulating layer having a first surface parallel to the first surface of the substrate;
   Step 3: etching the first insulating layer and a part of the substrate to form a plurality of first trenches and a plurality of second trenches arranged vertically and spaced apart, wherein lower parts of first side surfaces and second side surfaces of the plurality of first trenches and the plurality of second trenches are respectively constituted by a second surface and a third surface of the substrate, and upper parts of the first side surfaces and the second side surfaces of the plurality of first trenches and the plurality of second trenches are respectively constituted by a second surface and a third surface of the first insulating layer;
   Step 4: forming a second insulating layer on third bottom surfaces of the plurality of first trenches and the plurality of second trenches;
   Step 5: forming a single crystal nucleation layer on a second side surface of the plurality of first trenches, formed by the third surface of the substrate, and forming a single crystal nucleation layer on a first side surface of the plurality of second trenches, formed by the second surface of the substrate; and
   Step 6: making a first sub-layer of a first semiconductor layer grown epitaxially laterally; in the plurality of first trenches and the plurality of second trenches with the single crystal nucleation layer as a nucleation center, and then a third semiconductor layer grown with the first sub-layer as a core, and then further a second sub-layer of the first semiconductor layer grown with the third semiconductor layer as a core; wherein
   the first semiconductor layer has a first face and a second face opposite to the first face, which have a spontaneous polarization effect and a piezoelectric polarization effect, and are parallel to the first side surface and the second side surface of the first trenches and the second trenches and perpendicular to the first surface of the substrate; and
   the third semiconductor layer is N-type doped or P-type doped, and a projection of the third semiconductor layer onto the first face or the second face of the first semiconductor layer is configured to be within a range of, or partially overlaps with a projection of a gate onto the first face or the second face of the first semiconductor layer.

5. The method according to claim 4, wherein the second surface and the third surface of the substrate are of a hexagonal symmetrical lattice structure.

6. The method according to claim 4, wherein in Step 5, the single crystal nucleation layer is formed on a part of the second side surface of the plurality of first trenches, formed by the third surface of the substrate, and the single crystal nucleation layer is formed on a part of the first side surface of the plurality of second trenches, formed by the second surface of the substrate.

7. A semiconductor device, comprising:
   a substrate, the substrate having a first surface;

a first insulating layer, which is formed on the first surface of the substrate and has a first surface parallel to the first surface of the substrate; and a plurality of first trenches and a plurality of second trenches formed in the substrate, which are perpendicular to the first surface of the substrate and arranged as spaced apart, wherein lower parts of first side surfaces and second side surfaces of the plurality of first trenches and the plurality of second trenches are respectively constituted by a second surface and a third surface of the substrate, and upper parts of the first side surfaces and the second side surfaces of the plurality of first trenches and the plurality of second trenches are constituted by a second surface and a third surface of the first insulating layer;

a single crystal nucleation layer is formed on a second side surface of the plurality of first trenches, formed by the third surface of the substrate, and a single crystal nucleation layer is formed on a first side surface of the plurality of second trenches, formed by the second surface of the substrate; and a first semiconductor layer is grown epitaxially laterally in the plurality of first trenches and the plurality of second trenches, with the single crystal nucleation layer as a nucleation center; wherein the first semiconductor layer is divided into a first sub-layer and a second sub-layer of the first semiconductor layer along a length direction of the first trenches and the second trenches, and a third semiconductor layer that is doped is further arranged between the first sub-layer and the second sub-layer; wherein the first semiconductor layer has a first face and a second face opposite to the first face, which have a spontaneous polarization effect and a piezoelectric polarization effect, and are parallel to the first side surface and the second side surface of the first trenches and the second trenches and perpendicular to the first surface of the substrate; and the third semiconductor layer is N-type doped or P-type doped, and a projection of the third semiconductor layer onto the first face or the second face of the first semiconductor layer is configured to be within a range of, or partially overlaps with a projection of a gate onto the first face or the second face of the first semiconductor layer.

8. The semiconductor device according to claim 7, wherein the single crystal nucleation layer is formed on a part of the second side surface of the plurality of first trenches, and the single crystal nucleation layer is formed on a part of the first side surface of the plurality of second trenches.

9. The semiconductor device according to claim 7, wherein the second surface and the third surface of the substrate are of a hexagonal symmetrical lattice structure.

10. The semiconductor device according to claim 7, wherein the semiconductor device further comprises a second semiconductor layer, which is formed overlying the first semiconductor layer, wherein the forbidden band gap of the second semiconductor layer is greater than the forbidden band gap of the first semiconductor layer, so that two-dimensional electron gas and two-dimensional hole gas are respectively formed on the first face and the second face of the first semiconductor layer.

11. The semiconductor device according to claim 7, wherein the substrate further has a fourth surface, wherein the plurality of first trenches and the plurality of second trenches are perpendicular to the fourth surface of the substrate; and the first semiconductor layer protrudes from the fourth surface of the substrate, wherein the first face and the second face are perpendicular to the fourth surface of the substrate and protrude from the fourth surface of the substrate; the semiconductor device further comprises:

a third insulating layer, formed on the fourth surface of the substrate;

a second insulating layer, formed on third bottom surfaces of the plurality of first trenches and the plurality of second trenches;

a fourth insulating layer formed on a first side surface in the plurality of first trenches and a second side surface in the plurality of second trenches; and a second semiconductor layer, which is formed overlying the first semiconductor layer, wherein the forbidden band gap of the second semiconductor layer is greater than the forbidden band gap of the first semiconductor layer, so that two-dimensional electron gas and two-dimensional hole gas are respectively formed on the first face and the second face of the first semiconductor layer.

12. The semiconductor device according to claim 7, wherein the substrate further has a fifth surface parallel to the first surface but lower than the first surface, wherein the first semiconductor layer protrudes from the fifth surface of the substrate, wherein the first face is parallel to the first side surface of the plurality of first trenches and the second side surface of the plurality of second trenches and perpendicular to the fifth surface of the substrate and extends upwardly; the semiconductor device further comprises:

a third insulating layer, formed on the first surface and the fifth surface of the substrate;

a second insulating layer, formed on third bottom surfaces of the plurality of first trenches and the plurality of second trenches;

a fourth insulating layer formed on a first side surface in the plurality of first trenches and a second side surface in the plurality of second trenches; and a second semiconductor layer, which is formed overlying the first face of the first semiconductor layer, wherein the forbidden band gap of the second semiconductor layer is greater than the forbidden band gap of the first semiconductor layer, so that two-dimensional electron gas is formed on the first face of the first semiconductor layer.

13. The semiconductor device according to claim 7, wherein the substrate further has a sixth surface parallel to the first surface but lower than the first surface, wherein the first semiconductor layer protrudes from the sixth surface of the substrate, wherein the second face is parallel to the second side surface of the plurality of first trenches and the first side surface of the plurality of second trenches and perpendicular to the sixth surface of the substrate and extends upwardly; the semiconductor device further comprises:

a third insulating layer, formed on the first surface and the sixth surface of the substrate;

a second insulating layer, formed on third bottom surfaces of the plurality of first trenches and the plurality of second trenches;

a fourth insulating layer formed on a first side surface in the plurality of first trenches and a second side surface in the plurality of second trenches; and a second semiconductor layer, which is formed overlying the second face of the first semiconductor layer, wherein the forbidden band gap of the second semiconductor layer is greater than the forbidden band gap of the first semiconductor layer, so that two-dimensional hole gas is formed on the second face of the first semiconductor layer.

\* \* \* \* \*

UNITED STATES PATENT AND TRADEMARK OFFICE
CERTIFICATE OF CORRECTION

PATENT NO. : 12,432,958 B2  
APPLICATION NO. : 17/788030  
DATED : September 30, 2025  
INVENTOR(S) : Zilan Li Page 1 of 1

It is certified that error appears in the above-identified patent and that said Letters Patent is hereby corrected as shown below:

In the Claims

Column 22, Claim 6, Line 59 reads:
6. The method according to claim 4, wherein in Step 5, the
Whereas it should read:
6. The method according to claim 5, wherein in Step 5, the Signed and Sealed this  
Fourth Day of November, 2025

John A. Squires  
*Director of the United States Patent and Trademark Office*